United States Patent [19]
Bell et al.

[11] Patent Number: 5,917,239
[45] Date of Patent: Jun. 29, 1999

[54] RECESSED OR RAISED CHARACTERS ON A CERAMIC LID

[75] Inventors: Roy Bell, Gilbert, Ariz.; Kin Gan, Penang, Malaysia

[73] Assignee: Intel Corporation, Santa Clara, Calif.

[21] Appl. No.: 08/835,228

[22] Filed: Apr. 7, 1997

Related U.S. Application Data

[63] Continuation of application No. 08/565,056, Nov. 30, 1995, abandoned.

[51] Int. Cl.$^6$ .............................. H01L 21/00; H01L 23/04
[52] U.S. Cl. .......................... 257/704; 257/703; 257/697; 257/797
[58] Field of Search ..................................... 257/704, 797, 257/679, 703

[56] References Cited

U.S. PATENT DOCUMENTS

| | | | |
|---|---|---|---|
| 4,626,960 | 12/1986 | Hamano et al. | 257/704 |
| 4,833,102 | 5/1989 | Byrne et al. | 257/704 |

FOREIGN PATENT DOCUMENTS

| | | | |
|---|---|---|---|
| 0226506 | 10/1991 | Japan | 257/703 |
| 0272158 | 12/1991 | Japan | 257/704 |
| 0216265 | 8/1994 | Japan | 257/797 |

OTHER PUBLICATIONS

Translated Document of Japan 6–216265, Aug. 5, 1994.

*Primary Examiner*—Brian Dutton
*Assistant Examiner*—Hung Van Duong
*Attorney, Agent, or Firm*—Blakely, Sokoloff, Taylor & Zafman

[57] ABSTRACT

A method for pressing an identification mark into a ceramic lid of an integrated circuit package. The method includes the steps of mixing an oxide material with a binder to create a powder. The powder is then placed into a mold and pressed into a substrate with a press. The bottom of the press has raised or recessed portions arranged in the pattern of an identification mark. The raised or recessed portions press the mark into the powder when the powder is pressed into a substrate. The substrate is then removed from the mold and heated to harden the powder into a ceramic lid. The recessed or raised indicia are relatively deep and wide so that it is difficult to remove the mark with known grinding or laser techniques.

4 Claims, 1 Drawing Sheet

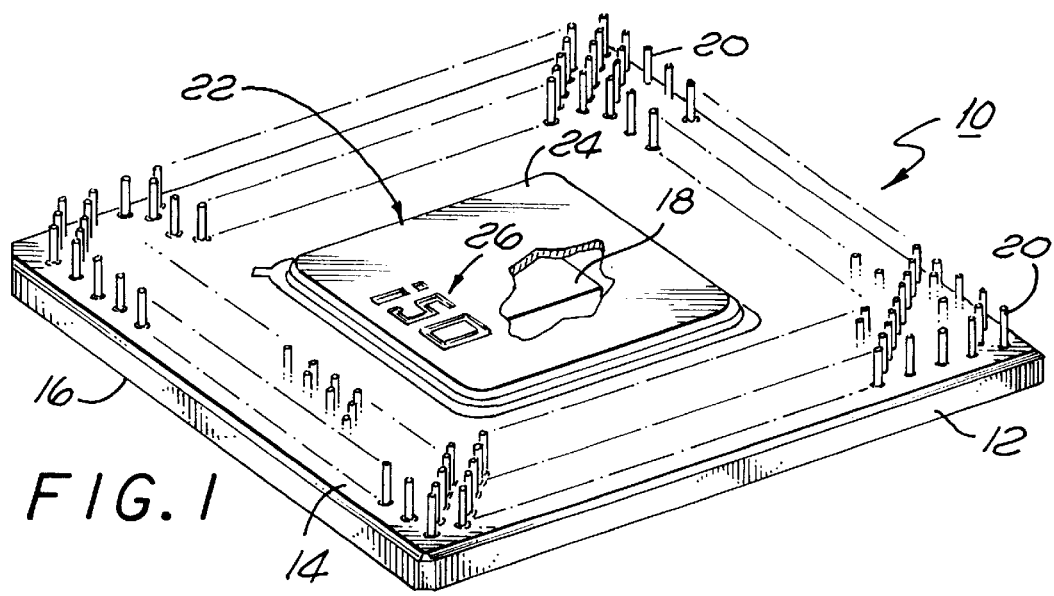
FIG. 1
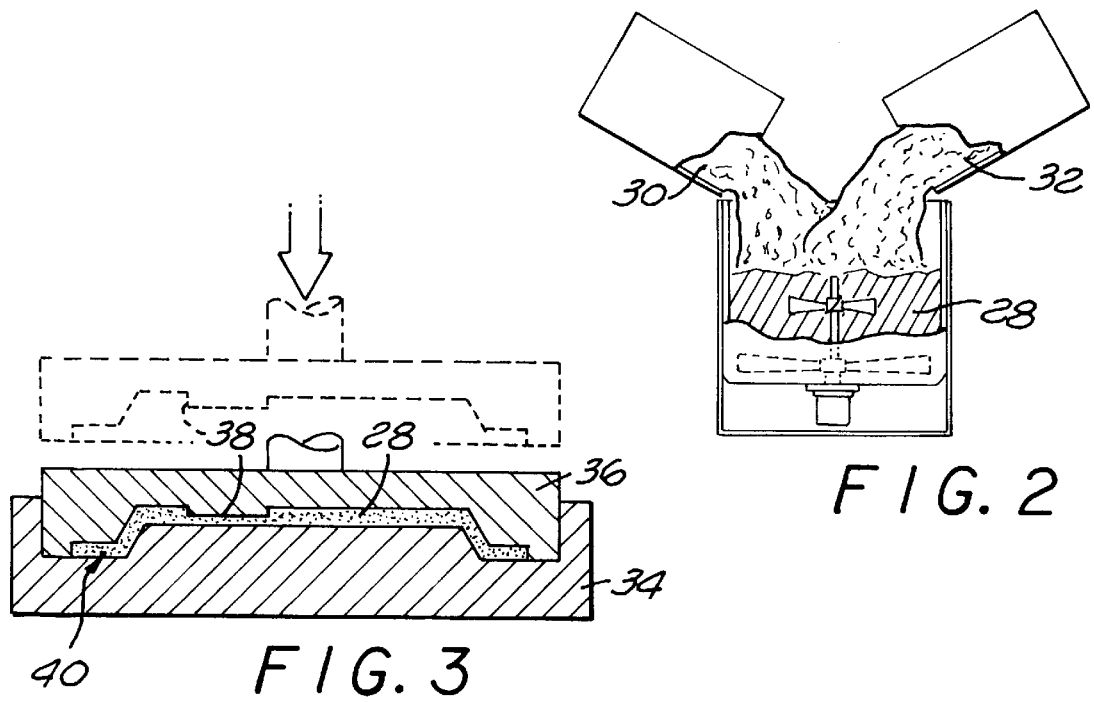
FIG. 2
FIG. 3
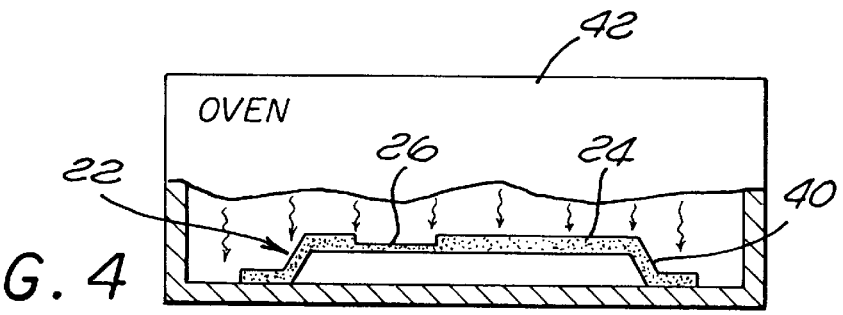
FIG. 4

RECESSED OR RAISED CHARACTERS ON A CERAMIC LID

This is a Continuation Application of application Ser. No. 08/565,056, filed Nov. 30, 1995, now abandoned.

BACKGROUND OF THE INVENTION

1. Field of the Invention

The present invention relates to an integrated circuit package.

2. Description of Related Art

Integrated circuits are housed within plastic or ceramic packages. The packages are soldered to printed circuit boards to create an electronic assembly. The packages are typically marked to identify the manufacturer and the product type of the integrated circuit. Prior art packages are typically marked by stamping the lid of the package with an ink indicia, or forming the indicia with a laser.

The relatively small size and high value of integrated circuits have made IC packages a target for theft. To prevent product tracing, the markings of stolen packages are typically removed before the items are re-introduced to the market. The packages may even be re-marked to provide a false designation of origin. It has been found that ink and laser markings are easy to grind off and replace. It would therefore be desirable to provide a method for marking an integrated circuit package with a source name or device characteristics, that would increase the difficulty of removing the mark.

SUMMARY OF THE INVENTION

The present invention is a method for pressing a raised or recessed identification mark into a sintered ceramic lid of an integrated circuit package. The method includes the steps of mixing an oxide material with a binder to create a powder. The powder is then placed into a mold and pressed into a substrate with a press. The bottom of the press has raised or recessed portions arranged in the pattern of an identification mark. The raised or recessed portions press the mark into the powder when the powder is pressed into a substrate. The substrate is then removed from the mold and heated to harden the powder into a ceramic lid. The recessed indicia are relatively deep and wide so that it is difficult to remove the mark with known grinding or laser techniques.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a perspective view of an integrated circuit package with a recessed identification mark;

FIG. 2 is a side view showing a powder being mixed;

FIG. 3 is a side view showing the powder within a press mold;

FIG. 4 is a side view showing the pressed powder being heated into a ceramic lid.

DETAILED DESCRIPTION OF THE INVENTION

Referring to the drawings more particularly by reference numbers, FIG. 1 shows an integrated circuit package assembly 10 of the present invention. The assembly 10 includes a package 12 which has a first surface 14 and an opposite second surface 16. The package 12 contains an integrated circuit 18. The integrated circuit 18 may be a microprocessor or any other electrical device. The package 12 is typically constructed from a co-fired ceramic material which has a plurality of internal routing traces (not shown), surface pads (not shown) and vias (not shown) that electrically connect the integrated circuit 18 with contacts 20 located on the first surface 14. The contacts 20 are typically pins which extend from the first surface 14 of the package 12.

Attached to the first surface 14 of the package 12 is a lid 22. The lid 22 encloses and seals the integrated circuit 18 within the package 12. The lid 22 has a first exposed surface 24 and an opposite second surface (not shown). The lid 22 has a recessed mark 26 located within the first surface 24.

The mark 26 typically includes indicia that designate the source and device characteristics. By way of example, the mark 26 may include the designation "i50", "i66", "i75", "i90", "i100" or "i133". The package and integrated circuit may be a microprocessor sold by Intel Corporation ("Intel"). The "i" may indicate that the integrated circuit is an Intel product. The numerals "50", "66", "75", "90", "100" and "133" may indicate the operating speed of the integrated circuit. For example, the marking "i50" may indicate that the package contains an Intel microprocessor that operates at 50 megahertz (MHz). The designation "i100" may indicate an Intel processor running at 100 MHz, and so forth and so on.

The mark 26 is typically pressed into the first surface 24 during the fabrication of the lid 22. To prevent the removal of the mark, the recessed indicia typically have a depth of at least 0.002 inches and a width of approximately 0.016 inches. The total thickness of the lid 22 is typically 0.030 inches. Having the above cited depths and widths will prevent third parties from grinding the first surface 24 to remove the mark 26 without significantly changing the structure of the lid 22. The recessed mark 26 of the present invention increases the difficulty of removing the indicia over packages of the prior art which have surface ink, or laser ablations, that are thinner and have less depth than the recessed mark 26.

FIGS. 2–4 shows a preferred process for fabricating the lid 22 of the package assembly 10. A powder 28 is created by mixing an oxide 30 with a binder 32. The oxide may be an aluminum or other known ceramic forming material. The powder 28 is then placed into a mold 34 that can receive a press 36.

The bottom of the press 36 has a raised or recessed portion 38 arranged in the pattern of the identification mark 26. The powder 28 is pressed into a substrate 40 by the press 36. In the preferred embodiment, a press is used to form the powdered substrate 40. The press 36 also presses the identification mark 26 into a surface of the substrate 40. The pressed powdered substrate 40 is then removed from the mold 34 and placed in an oven 42. The oven 42 fires the substrate 40 to create a ceramic lid 22. The substrate 40 is typically heated at a temperature of approximately 1400° centigrade. The recessed mark 26 remains embedded in the first surface 24 of the lid 22.

The present invention provides a process that allows the identification mark 26 to be pressed into the powder during the pressing step of the lid 22 fabrication. The present invention thus eliminates any additional stamping, or laser ablating, step required by prior art techniques to mark the lid of an integrated circuit package. The recessed or raised mark 26 area of the first surface 14 is typically identified by residual stresses in the lid 22 that are created by the pressing process. This is to be distinguished from laser ablated marks which merely remove material without pressing and stressing the powder material on the lid 22.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a package which has a first surface and an opposite second surface;

a plurality of contacts on said first surface of said package; and, a lid attached to said first surface of said package, said lid having an outer surface with a recessed indicia.

2. The package as recited in claim 1, wherein said lid is constructed from a ceramic material.

3. An integrated circuit package, comprising:

a package which has a first surface and an opposite second surface;

an integrated circuit within said package;

a plurality of contacts on said first surface of said package; and, a lid that is approximately 0.030 inch thick and is attached to said first surface of said package, said lid having an outer surface with a recessed indicia that is pressed into said outer surface, said indicia having a depth of at least 0.002 inch and a width of at least 0.016 inch.

4. The package as recited in claim 3, wherein said lid is constructed from a ceramic material.

* * * * *